United States Patent [19]

Moksvold

[11] Patent Number: 4,560,583
[45] Date of Patent: Dec. 24, 1985

[54] RESISTOR DESIGN SYSTEM

[75] Inventor: Tor W. Moksvold, Poughkeepsie, N.Y.

[73] Assignee: International Business Machines Corporation, Armonk, N.Y.

[21] Appl. No.: 626,189

[22] Filed: Jun. 29, 1984

[51] Int. Cl.$^4$ ............................................. H01L 21/66
[52] U.S. Cl. ........................................ 427/88; 29/574; 29/593; 427/96; 427/101; 427/102; 427/103; 427/8
[58] Field of Search .............. 427/8, 88, 96, 101–103; 29/574, 593; 430/296

[56] References Cited

U.S. PATENT DOCUMENTS

| | | | |
|---|---|---|---|
| 3,879,236 | 4/1975 | Langdon | 427/102 |
| 4,088,799 | 5/1978 | Kurtin | 427/88 |
| 4,184,062 | 1/1980 | Schmidt | 29/593 |
| 4,196,228 | 4/1980 | Priel | 427/88 |
| 4,338,351 | 7/1982 | Bloom | 427/101 |
| 4,347,479 | 8/1982 | Cullet | 324/64 |
| 4,467,312 | 8/1984 | Komatsu | 427/82 |

OTHER PUBLICATIONS

C. G. Jambotkar, "Resistors with Submicron Width" IBM Technical Disclosure Bulletin, vol. 24, No. 12, May 1982, pp. 6434–6436.
D. Basire, "Resistance and Dimension Characterization Via Kerf Automatic In-Line Tests" IBM Technical Disclosure Bulletin, vol. 23, No. 5, Oct. 1980, pp. 1963–1968.

Primary Examiner—John D. Smith
Attorney, Agent, or Firm—T. Rao Coca

[57] ABSTRACT

Disclosed is a method of forming a precision integrated resistor element on a semiconductor wafer whose resistance value accurately corresponds to its nominal design value. The method comprises forming a resistor body in combination with a test resistor structure by conventional ion implantation or diffusion of suitable dopant in selected regions of the wafer. Then, by measuring the resistance(s) and width(s) of the test structure the variation $\Delta\rho_s$ in sheet resistance and variation $\Delta W$ in width due to process and image tolerances, respectively, are determined. Next, using $\Delta\rho_s$ and $\Delta W$ the adjustment in length $\Delta L$ necessary to match the resistance of the resistance element with the nominal design value is calculated. Finally, this information ($\Delta L$) is supplied to an E-beam generating system to expose an E-beam sensitive contact level layer formed on the resistor body to form metal contact openings for the resistor body at a separation which provides a resistor having a resistance value corresponding to the design value.

13 Claims, 7 Drawing Figures

RESISTOR DESIGN SYSTEM

BACKGROUND OF THE INVENTION

This invention relates to a method of making an integrated circuit resistor element on a semiconductor body and, more particularly, to a method of making an ion implanted or diffused integrated circuit resistor on a silicon substrate whose resistance value accurately corresponds to its nominal design value.

The conventional technique of forming an integrated circuit resistor is by ion implanting or diffusing a predetermined area of a semiconductor substrate, typically, rectangular in shape forming a resistor bar having a known width W and sheet resistance $\rho_s$, and placing metal contacts contacting the bar at a known separation L which determines the length of the resistor. From the known design values of $\rho_s$, W and L the design resistance value R is deduced by the approximate relationship $R = \rho_s L/W$. However, due to process tolerances and dimension tolerances, the actual or measured value may significantly differ from the design value resulting in poor or erroneous performance of the circuits utilizing the resistor element.

To briefly elaborate on the above-mentioned deleterious process and dimension tolerances, in the fabrication of the integrated circuit resistor elements in conjunction with other passive elements and active elements which together constitute the integrated circuit, numerous processing steps such as ion implantation/diffusion, epitaxial growth, metallization, etc., coupled with corresponding lithographic steps involving a large number of masks are performed. For example, in very large scale integration technologies, some 10 different masks are required for an insulated gate field effect transistor and approximately 15 masks are used for a bipolar transistor. It is well known that when the semiconductor body is subjected to an ion diffusion step by depositing dopant species in a designated area followed by thermal drive-in to form the resistor bar generally simultaneously with other elements (e.g., the base of a NPN transistor) of the integrated circuit, the dopant profile will not be uniform due to inherent variations in the dopant species concentration, temperature, etc. Similar variation occurs when the resistor bar is formed by ion implantation. As a result, the sheet resistance of the resistor bar differs from the design value. Likewise, the various masks used in the fabrication of the resistor element vary from the specification established by the designer, as a consequence of undesirable effects such as over-exposure or under-exposure of the organic (photoresist) layers which may occur during the fabrication of the masks. Also, even if the width of the mask is equivalent to the desired nominal width W of the resistor bar, any over-exposure or under-exposure of the photoresist layer on the wafer and any overetching or underetching of the insulating layer will result in the ion diffused or implanted region being too wide or too narrow as compared to the nominal value.

A more complete expression for the resistance of the resistor than the one discussed above which takes into account contact resistance and current crowding resistance can be written as:

$$R = R_b + R_{cc} + R_c \quad (1)$$

where $R_b$ designates the resistance of the body of the resistor having a constant width W, $R_{cc}$ resistance due to current crowding and $R_c$ is the contact resistance associated with the interface between the resistor bar and the metal contact. To explain the various terms of equation (1), reference is made to FIG. 1 wherein is shown in top view a rectangular resistor bar generally designated by numeral 10 of width W having two metal contacts 11 and 12 formed at a separation L corresponding to the nominal design length of the resistor which is obtained from the contact level mask. The metal contacts 11 and 12 for the resistor shown do not extend over the entire width W of the resistor bar 10. Consequently, when the contacts 11 and 12 are maintained at different electrical potentials, since the electric charges tend to take the path of least resistance, the resistor bar, instead of having a rectangular section of length L and width W will have two current crowding sections 13 and 14 and a body portion 15. As illustrated in FIG. 1, the current crowding sections 13 and 14 have a varying width and a relatively small length both contributing a resistance $R_{cc}$. The body portion 15 is rectangular in shape having a length $L_b$ and width W contributing a resistance $R_b = \rho_s L_b/W$. The resistance $R_c$ is due to contact resistance associated with the interfaces between the resistor bar 10 and the metal contacts 11 and 12.

As a result of the above variation $\Delta \rho_s$ in sheet resistance and the variation $\Delta W$ in the resistor width, the actual resistance may be significantly different from the design value unless the spacing between the contacts 11 and 12 (i.e., the length L of the resistor) is appropriately adjusted. For example, when the net contribution to the resistance due to the process and image tolerances is positive, the spacing between the contacts 11 and 12 may be required to be shortened by a corresponding amount $\Delta L$ as shown in FIG. 2 to compensate for the positive contribution. Likewise, when the net contribution to the resistance due to the various tolerances is negative, the spacing L may be required to be increased by $\Delta L$ as shown in FIG. 3 in order to accurately compensate for the negative contribution and match the actual resistance of the resistor element with its nominal design value.

In the prior art process of forming integrated circuit resistor elements, since the contact level mask is designed and fabricated at the outset in accordance with the particular integrated circuit chip design, it is impossible to correct for the above errors by appropriately adjusting the separation L between the contact openings 11 and 12 for each resistor element on the chip. The only way it is possible to obtain a resistor whose measured value closely matches the nominal design value is by exercising stringent controls over the ion diffusion/implantation process step, over image tolerances, over the relevant etching steps, etc. Despite such tight controls, deviations in the order of 15-20% of the actual resistance from the design value are unavoidable.

Accordingly, it is an object of this invention to provide a method of forming precision resistors on a semiconductor body.

It is another object of this invention to provide a method of forming integrated circuit resistor whose resistance value accurately corresponds to its nominal design value by correcting during its fabrication for variation inherently introduced due to process variations and image tolerances.

It is yet another object of this invention to provide a method of making highly accurate resistors integrated with other passive and active elements of an integrated circuit by dynamically making individual photo process adjustments for the resistors' contact locations.

SUMMARY OF THE INVENTION

The above objects and other related objects and advantages may be achieved through the use of a novel process herein disclosed. In one preferred embodiment of this invention, the process comprises forming the resistor bar in the conventional fashion by ion diffusion-/implantation, etc., up to the metal contact level process step in combination with a pair of test resistor structures in the Kerf region or a specialized test site of the semiconductor wafer. The test resistor structures are formed adjacent to each other, to have identical length and different widths. By electrically measuring the resistances of the test structures, the deviations in width ($\Delta W$) and sheet resistance ($\Delta \rho_s$) of the test resistor structures from the design value are obtained. Next, using $\Delta W$ and $\Delta \rho_s$, with the aid of a resistor model, the adjustment in length ($\Delta L$) necessary to match the resistance of the resistor bar accurately with the nominal design value is calculated. Finally, the information ($\Delta L$) is supplied to an E-beam (electron beam) generating system which has been programmed with the contact level design information to expose the contact level using E-beam to form in the resistor bar resistor contact areas at a separation which provides a resistor having a resistance value corresponding to the nominal design value. Thereafter metallization in the contact areas is accomplished in the conventional fashion.

BRIEF DESCRIPTION OF THE DRAWINGS

The novel features and process steps characteristic of the invention are set forth in the appended claims. The invention itself, however, will be best understood by reference to the detailed description which follows in conjunction with the accompanying drawings wherein:

DETAILED DESCRIPTION OF THE PREFERRED EMBODIMENTS

Figure 1:
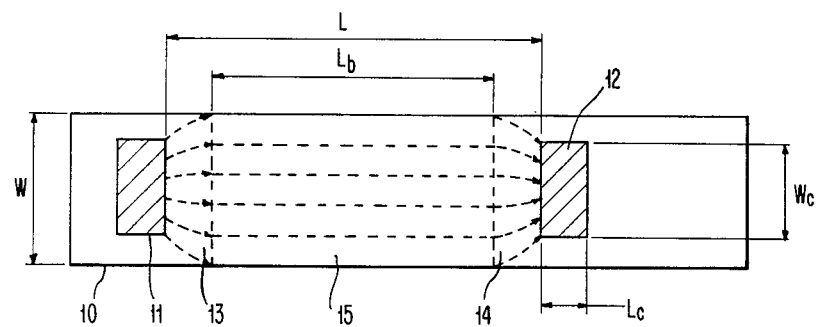
FIG. 1 shows a schematic top view of a resistor structure illustrating the various characteristic dimensions.

In general, the resistance R of an integrated circuit resistor is a function of several variables, the principal of which being the sheet resistance $\rho_s$, the width W and length L. This relationship can be mathematically expressed as $$R = f(\rho_s, W, L, \ldots) \qquad (2)$$

consequently, variations in the variables $\rho_s$, W, L, etc., introduce a variation dR in the resistance R given by $$dR = \frac{\partial R}{\partial \rho_s} d\rho_s + \frac{\partial R}{\partial W} dW + \frac{\partial R}{\partial L} dL + \ldots \qquad (3)$$

In practice, the goal of precision integrated resistor manufacturers is to match the actual resistance with the design resistance. This is achieved only when dR is reduced zero or as close to zero as possible. This, in turn, can be accomplished by adjusting the length of the resistor to compensate for the changes $d\rho_s$, dW, etc., solving equation (3) for dL, $$dL = -\left(\frac{\partial R}{\partial \rho_s} d\rho_s + \frac{\partial R}{\partial W} dW + \ldots\right) / \frac{\partial R}{\partial L} \qquad (4)$$

dL in equation (4) designates the theoretical adjustment in the resistor length necessary to compensate for the changes in $\rho_s$, W, etc., so that the net deviation in resistance from the design value is zero.

While the theoretical total differential dL given above (equation (4)) is a good approximation for the actual change $\Delta L$ in the case of simple resistor models, the partial derivatives required for its calculation are not normally available in an analytical form for complex resistor models. In practice, a resistor model is used to facilitate computer simulation of an integrated circuit comprising the resistor. The resistor model may be simple or complex depending on the particular design of the integrated circuit, the particular process technology and the accuracy required for the particular case. It may be a nominal model, a simple statistical model or an elaborated statistical model for computer simulation.

A functional representation of a resistor model is as follows:

$$R = R(\rho_s, W, L, \ldots) \qquad (5)$$

The variation $\Delta R$ due to variations $\Delta \rho_s$, $\Delta W$, etc., are calculated for the resistor model using $$\Delta R = R(\rho + \Delta \rho_s, W + \Delta W, L, \ldots) - R(\rho_s, W, L, \ldots) \qquad (6)$$

where $R(\rho + \Delta \rho_s, W + \Delta W, L \ldots)$ designates the resistance that would obtain if no correction to the length were made and $R(\rho_s, W, L, \ldots)$ designates the nominal design resistance.

From the $\Delta R$ obtained, a $\Delta L$ correction to the resistor design length is determined by the equation $$\Delta L = -\Delta R (W + \Delta W)/(\rho_s + \Delta \rho_s) \ldots \qquad (7)$$

Since $\Delta R$ could be positive or negative, the length correction $\Delta L$ may be an addition to or subtraction from the design length.

Once the length correction $\Delta L$ has been implemented, the actual resistance value would be precisely equal to the design resistance value. That is, $$R(\rho_s + \Delta \rho_s, W + \Delta W, L + \Delta L, \ldots) = R(\rho_s, W, L, \ldots)$$

where $R(\rho_s + \Delta \rho_s, W + \Delta W, L + \Delta L, \ldots)$ designates the actual resistance with the length correction.

To realize precision resistors in accordance with this invention, device resistor bodies are formed in a semiconductor wafer by conventional diffusion or ion implantation of a suitable dopant in combination with a test resistor structure in a pre-designated region, for example, the Kerf region of the wafer. Typically, the resistor bodies are formed after providing for suitable electrical isolation from other elements on the integrated circuit chip. The doping step to establish the necessary sheet resistance is typically accomplished in the same process to form other like-doped areas on the chip. For example, in the bipolar device integrated cicuit fabrication process, the dopant step to form the resistor body could be the same step in which the base of the bipolar device is formed. In as much as the resistor body forming steps by ion implantation or diffusion are well-known, a detailed description of this technique will not be presented here.

The resistor bodies could be of any shape depending on the shape desired for the resistor element. These include but not limited to the straight bar shapes, curved shape, dog-bone shape, step shape, zig-zag shape, shapes having more than one width and, in general, arbitrary shapes. For convenience of discussion, the invention will be described with reference to a bar shaped resistor body.

The nature of the test resistor structure referred to hereinabove is dictated by the degree of compensation to the resistance of the resistor element due to the various tolerances that is desired. If only compensation for error in the resistance due to the variation in sheet resistance is desired, then the test resistor structure, shown in FIG. 4A, could be used. If compensation for error in the resistance due to variations in both sheet resistance and width of the resistor is desired, then the test resistor structure illustrated in FIG. 4B would be appropriate.

Figure 4A:
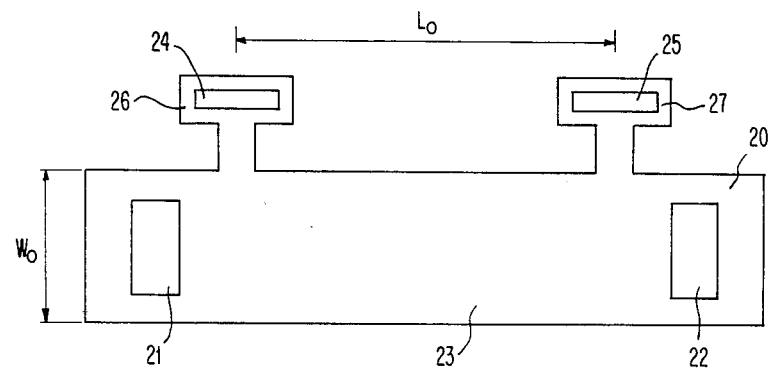
FIGS. 4A and 4B are schematic top views of conventional test resistor structures for utilization in accordance with the principles of the present invention to determine the deviations in sheet resistance and width of the resistor element from the corresponding design values.

The test structure shown in FIG. 4A is a conventional structure for determining the sheet resistance by measuring the resistance R of the test structure and deducing the sheet resistance $\rho_s$ therefrom by using the design width and length. The test structure consists of a resistor bar 20 having current contact openings 21 and 22 for forcing a current through the test resistor body 23 and voltage contact openings 24 and 25 in the sense arms 26 and 27, respectively, for sensing the voltage thereacross. From the known (design) values of the width $W_o$ of the test resistor and the separation $L_o$ between the voltage arms and the measured resistance R the measured sheet resistance $\rho_s^m$ of the test structure can be obtained from the relationship $\rho_s^m = R\, W_o/L_o$. Since the sheet resistance $\rho_s^m$ is measured using a perfectly rectangular portion of the resistor body 20, current crowding errors discussed hereinabove will not come into the picture.

Figure 2:
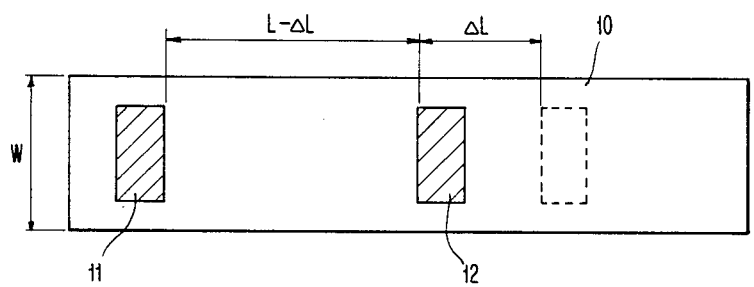
FIGS. 2 and 3 are schematic top views of the resistor structure of FIG. 1 illustrating the corrections to the spacing between metal contact openings necessary due to positive and negative contributions, respectively, to the resistance value of the resistor due to various process and image tolerances.
Figure 3:
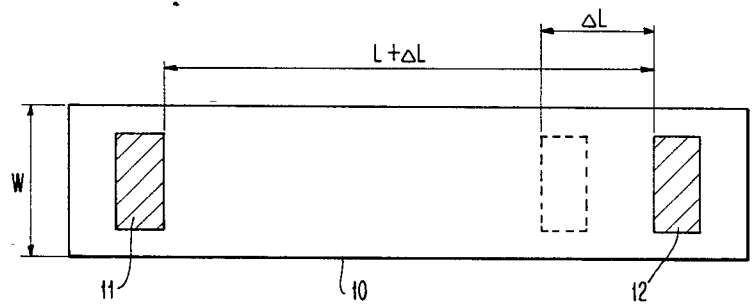

Once the measured sheet resistance $\rho_s^m$ is known, the deviation $\Delta \rho_s$ of this resistance from the nominal or design sheet resistance $\rho_s^d$ can be readily determined. Then, using $\rho_s^m$ the corresponding variation in resistance $\Delta R$ of the resistor element due to variation in sheet resistance is calculated. The $\Delta R$ value so obtained is next translated into a correction $\Delta L$ to the resistor element length by using a resistor model. $\Delta L$ represents the adjustment to the spacing between the metal contact openings 11 and 12 (FIGS. 1–3) that is necessary to compensate for variation in sheet resistance. The correction $\Delta L$ is then fed to a E-beam generating system which has been programmed with the design information pertaining to the contacts of the resistors to appropriately adjust the design length L (i.e., separation between contact openings 11 and 12) and enable contact openings to be formed in the separation of $L + \Delta L$ or $L - \Delta L$ as the case may be.

The remainder of the process steps after forming the contact openings in accordance with the above process steps are conventional. These include metal evaporation and metal patterning to form the resistor contacts. The contact metal at one or both ends of the resistor should be long enough to accommodate the maximum $\pm \Delta L$ variation in the location of the contact openings so that changes in contact metal can be avoided.

Figure 4B:
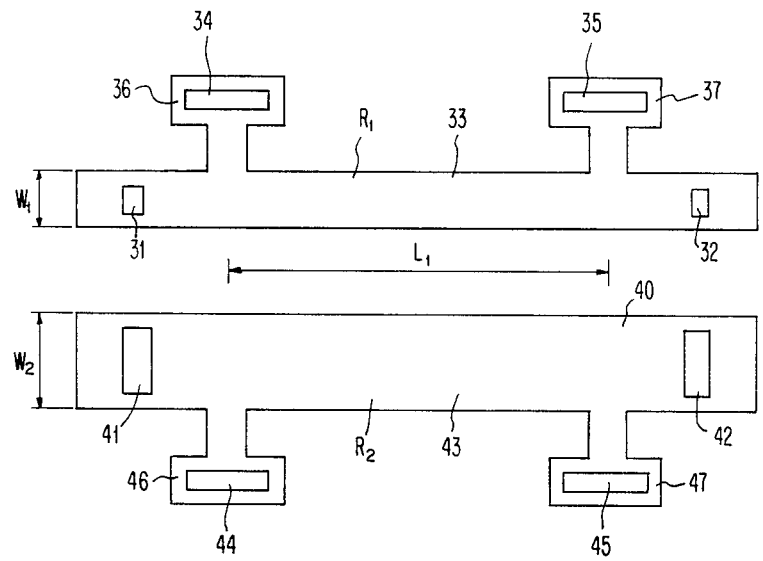

To compensate for variations in both $\rho_s$ and W, the test resistor structure shown in FIG. 4B is utilized. This test structure consists of two resistors having resistance values $R_1$ and $R_2$ formed side-by-side. The resistors $R_1$ and $R_2$ are similar in construction to the single resistor structure shown in FIG. 4A and consist of various elements designated by numerals 30–37 in case of resistor $R_1$ and 40–47 in case of resistor $R_2$ which correspond, respectively, to like elements designated by numerals 20–27 in FIG. 4A. The test resistors $R_1$ and $R_2$ have the same length $L_1$, but have different widths designated $W_1$ and $W_2$, respectively, the width $W_1$ being much smaller than the width $W_2$.

By utilizing the test resistors shown in FIG. 4B, the resistances $R_1$ and $R_2$ are measured in the conventional fashion by forcing a current through the resistor structures and measuring the voltage between the voltage arms. Assuming that due to their close proximity the deviation from the design width $\Delta W$ for the two test resistors of FIG. 4B are the same and also that the variation in sheet resistance $\rho_s$ for the two resistors is the same, $R_1$ and $R_2$ are related to their corresponding dimensional and other parameters by the expressions $$R_1 = \rho_s^m L_1 / (W_1 + \Delta W) \tag{8}$$

and $$R_2 = \rho_s^m L_1 / (W_2 + \Delta W) \tag{9}$$

solving equations (2) and (3) for $\Delta W$, we get $$\Delta W = (W_2 R_2 - W_1 R_1)/(R_1 - R_2) \tag{10}$$

and $$\rho_s^m = (W_2 - W_1) R_1 R_2 / L_1 (R_1 - R_2) \tag{11}$$

$$\Delta \rho_s = \rho_s^m - \rho_s^d \tag{12}$$

Once $\Delta W$ and $\Delta \rho_s$ are known, the deviation $\Delta R$ of the bulk resistance of the resistor element from the design value is determined using a resistor model. Next, the correction $\Delta L$ to offset the $\Delta R$ is calculated using a resistor model and the correction $\Delta L$ is supplied to a E-beam generating system to adjust the spacing between the openings for resistor element metal contact, as previously discussed.

Thus, in accordance with this invention a correction for deviation in L due to various process steps in the fabrication of resistors is dynamically achieved in essentially the final processing step with the net result that the resistance corresponds exactly with what the designer intended. To illustrate the degree of precision that can be achieved for the resistors fabricated in accordance with the invention vis-a-vis the prior art, several specific examples are provided. Assume that the nominal design values of the resistor element that is to be fabricated are as follows: Design resistance R=1000 ohms, Width W=10 μm, sheet resistance $\rho_s^d$=400 ohms/square and a length L=25 μm.

Case 1: ΔL Correction for variation in $\rho_s$

If the variation in $\rho_s$ is +10%, then the resistance of a resistor fabricated in accordance with the prior art methods would differ from the nominal design value by a corresponding 10% or the actual or measured resistance $R_m$ would be larger than the design value by 100 ohms since $$R_m = (\rho_s^d + \Delta\rho_s)L/W = 1100 \text{ ohms.}$$

In accordance with this invention to correct for the variation in $\rho_s$, the new length between the resistor contact openings will have to be $$L_{new} = RW/(\rho_s^d + \Delta\rho_s) = 22.727 \text{ μm.}$$

In other words, the spacing between the contacts will have to be decreased by 25−22.727=−2.27 μm. Rounding this correction to a 0.1 μm design grid yields a ΔL of 2.3 μm. By feeding this correction to the E-beam generating system, contact openings for the resistor are formed at a separation of 22.7 μm resulting in a resistor element having a resistance of 998.8 ohms which deviates from the design value by a mere 0.12%.

Case 2: ΔL Correction for variation in W

If the variation in the width of the resistor is −1.0 μm, then the resistor fabricated in accordance with the prior art will have an actual resistance of $$R_n = \rho_s L/(W + \Delta W) = 1111.1 \text{ ohms}$$

or a 11.1% increase over the design value.

To compensate for this variation in W, the length between contacts should have a value given by $$L_{new} = (W + \Delta W)R_d/\rho_s = 22.5 \text{ μm}$$

In other words, the L correction necessary on a design grid of 0.1 μm is exactly 2.5 μm. The resistor fabricated by forming the contact openings at this corrected separation will have a resistance of 1000 ohms, matching exactly with the design value.

Case 3: ΔL Correction for both $\rho_s$ and W Variations

When both variations discussed in cases 1 and 2 are present, the resistance of the resistor, per the prior art techniques of fabrication, will be $$R = (\rho_s + \Delta\rho_s)L/(W + \Delta W) = 1222.2 \text{ ohms}$$

or a 22.2% higher than the design value. By using the present invention, a new length $L_{new}$ for the resistor is used instead of the design length, where $$L_{new} = (W + \Delta W)R/(\rho_s + \Delta\rho_s) = 20.45$$

In other words, the ΔL correction necessary in this case, on a design grid of 0.1 μm is 4.5 μm. The resulting resistor will have a resistance which matches with the normal design value within 0.2%.

While a simplified resistor model has been utilized in the above examples to calculate ΔL, the invention is quite amenable for use with a computerized resistor model such as those used with the ASTAP program product commercially available from the IBM Corporation for computer simulation of integrated circuits. This is a statistical model which takes into account the image tolerances associated with all the masks and process tolerances associated with all the process steps utilized in the fabrication of the resistors and generates the correction ΔL necessary.

The invention can be implemented at different levels—job level, wafer level, chip level, individual resistor element level—depending on the degree of precision of the resistors desired. For job level implementation involving a batch of wafers, representative wafers are selected. A test resistor structure of the type shown in FIGS. 4A or 4B, depending on whether compensation for $\rho_s$ variation only or for variation on both $\rho_s$ and W is desired, is formed in the Kerf regions of the wafers and the deviation $\Delta\rho_s$ and/or ΔW is determined. Then, using the resistor model the ΔL correction necessary to compensate for the projected change in $\rho_s$ and/or W from the nominal design value are obtained and this correction is applied for the entire job. This ΔL correction will be first order correction since it represents an average correction for the whole job. In practice, since $\rho_s$ and W vary from wafer to wafer and within each wafer from chip to chip, a higher order correction may be necessary. To apply the correction at the wafer level, each wafer in the production cycle is kept track of by scribing the wafers with a production number, and by means of test structures formed on each individual wafer the ΔL compensation is obtained for the particular wafer. This level of implementation provides a higher order of correction than the job level.

Figure 5A:
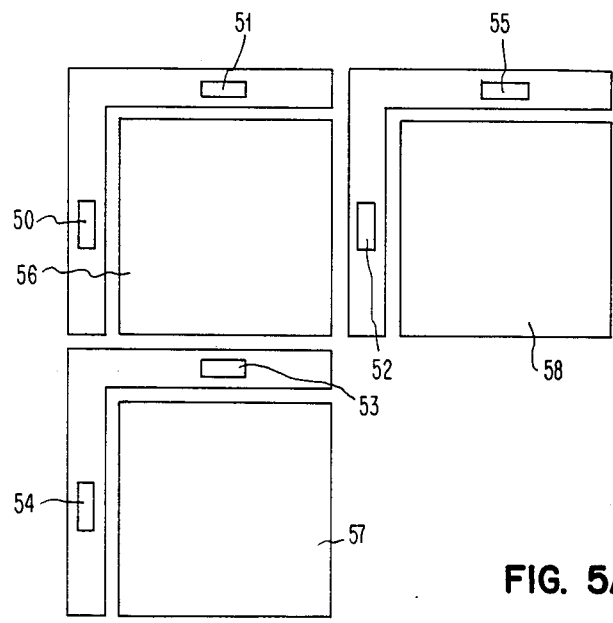
FIGS. 5A and 5B illustrate the general arrangement of test resistor structures to map variations in sheet resistance and width of the resistor elements over a single chip and over a group of chips on a semiconductor wafer, respectively.
Figure 5B:
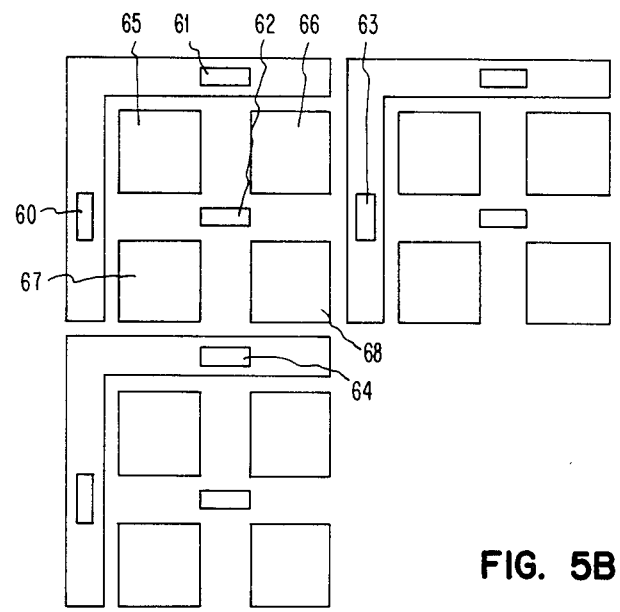

Likewise, for chip level correction, test resistor structures may be formed in the vicinity of each chip in the Kerf regions of the wafer and the ΔL correction is achieved obtaining thereby a higher order correction than the wafer level correction. One suitable arrangement of test structures for a 2×2 chip array on a wafer is illustrated in FIG. 5B where the test structures are designated by numerals 60–64 and the chips are designated 65–68.

To obtain yet higher levels of correction involving correction of each individual resistor element a plurality of test structures strategically located around each individual chip to map the variation in $P_s$ and W as a function of position on the chip. One suitable arrangement of test structures is illustrated in FIG. 5A wherein the test structures are designated by numerals 50–55 and the chips by 56–58. Mapping $\rho_s$ and W variation in this manner the ΔL correction necessary at the location of each resistor element is obtained.

Thus, there has been provided, in accordance with the invention, a method of fabricating precision integrated circuit resistor elements by dynamically correcting for variations inherent to the process of forming the resistors.

While the invention has been described in conjunction with a specific preferred embodiment, it is evident that many alternatives, modifications and variations will be apparent to those skilled in the art in light of the foregoing description. For example, while the invention specifically teaches using an E-beam in combination with an E-beam sensitive contact level layer for forming contact openings for resistor contact placement, the invention can be quite conveniently practiced by using an ion beam or a laser beam for direct exposure of a suitable contact level layer.

An alternative to the direct write approach is exposing a mask with the new separation between resistor contact openings obtained by adjusting the design spacing with the ΔL correction and then using that mask to transfer the new contact locations to each resistor bar on the chip/wafer.

Another variation of the present invention is, instead of forming the device resistor bodies and test resistor structures by ion implantation or diffusion of a suitable dopant into a semiconductor substrate, forming a thick or thin film of material having a desired sheet resistance on a substrate and patterning the film in the desired configuration. One example of this process is forming a suitably doped polysilicon after providing for appropriate electrical isolation on a semiconductor substrate and etching the polysilicon by reactive ion etching or other etching techniques into a pattern of device resistor bodies and test resistor structure(s).

It is therefore contemplated that the appended claims will embrace any such alternatives, modifications and variations as fall within the true scope and spirit of the invention.

What is claimed is:

1. A method of making a precision integrated resistor having a predetermined design resistance R and length L on a semiconductor body, said method comprising the steps of:
    (a) introducing dopant in selected regions of the semiconductor body to form a resistor pattern including a device resistor body of a predetermined shape and a test resistor structure having a predetermined design sheet resistance;
    (b) measuring the sheet resistance of the test resistor structure and determining the difference $\Delta\rho_s$ between the measured sheet resistance and said predetermined design sheet resistance;
    (c) calculating by utilizing $\Delta\rho_s$, the adjustment in length ΔL to said design length L necessary to obtain a resistor whose resistance corresponds to said design resistance R and obtaining a new length L±ΔL; and
    (d) forming a pair of metal contacts contacting said device resistor body at a separation corresponding to said new length.

2. A method of making a precision integrated resistor having a predetermined design resistance R and design length L on a semiconductor body, said method comprising the steps of:
    (a) introducing dopant in selected regions of the semiconductor body to form a resistor pattern including a device resistor body of a predetermined shape and a test resistor structure having a predetermined design sheet resistance $\rho_s^d$ and design width;
    (b) measuring the sheet resistance $\rho_s^m$ of the test resistor structure and obtaining the difference $\Delta\rho_s$ between the design and measured sheet resistance values and the variation ΔW in design width;
    (c) calculating by utilizing $\Delta\rho_s$ and ΔW the adjustment in length ΔL to said design length L necessary to obtain a resistor whose resistance corresponds to said design resistance R and obtaining a new length L±ΔL; and
    (d) forming a pair of metal contacts contacting said device resistor body at a separation corresponding to said new length.

3. The method as recited in claim 1 or 2 wherein said step (d) comprises:
    forming a contact level layer which is sensitive to an E-beam on said semiconductor body; and
    supplying said adjustment ΔL to an E-beam generating system to expose said layer using an E-beam to form contact areas on said device resistor body at a separation corresponding to said new length.

4. The method as in claim 2 wherein said test resistor structure comprises a side-by-side arrangement of a relatively narrow test resistor bar and a relatively wide test resistor bar having predetermined design widths $W_1$ and $W_2$, respectively.

5. The method as in claim 4 wherein said step of obtaining the difference $\Delta\rho_s$ comprises measuring the resistance of said relatively wide test resistor bar and calculating the measured sheet resistance of said wide test resistor bar and obtaining the difference between said measured and design sheet resistance values of said wide test resistor bar.

6. The method as in claim 4 wherein said step of obtaining the variation ΔW and the difference $\Delta\rho_s$ comprises measuring the resistance values $R_1$ and $R_2$ corresponding to an identical length $L_1$ of said narrow and wide test resistors, respectively, and calculating ΔW by using the relationship $W=(W_2R_2-W_1R_1)/(R_1-R_2)$ and calculating Δρ by using the relationships $$\rho_s^m = (W_2 - W_1)R_1R_2/L_1(R_1 - R_2)$$

and $$\Delta\rho = \rho_s^m - \rho_s^d.$$

7. The method as in claim 3 wherein said shape is rectangular.

8. A method of forming a plurality of integrated circuit resistors on a semiconductor substrate, said resistors each having predetermined design resistance $R_i$ (i=1,2,3 ...) and lengths $L_i$ (i=1, 2, 3 ...), said method comprising:
    (a) introducing dopant in selected areas of the substrate to form a plurality of resistor bodies as a precursor to said resistors and a test resistor structure having a predetermined design sheet resistance $\rho_s^d$;
    (b) measuring the sheet resistance of said test structure and determining the deviation $\Delta\rho_s$ of said design sheet resistance from the measured sheet resistance;
    (c) calculating, by utilizing the $\Delta\rho_s$, the necessary adjustment in length ΔL to said design lengths to obtain resistors whose resistances corresponds precisely to their design resistances $R_i$ and obtaining their new lengths $L_i \pm \Delta L$; and
    (d) forming a contact level layer which is sensitive to E-beam on said substrate; and
    (e) supplying said adjustment in length ΔL to an E-beam generating system to form a pair of contact areas on each of said resistor bodies at a separation corresponding to said new lengths $L_i \pm \Delta L$; and
    (f) forming metal contacts in said contact areas.

9. A method of forming a plurality of integrated circuit resistors on a semiconductor substrate, said resistors each having predetermined design resistances $R_i$ (i=1, 2, 3 ...) and lengths $L_i$ (i=1, 2, 3 ...), said method comprising the steps of:
    (a) introducing dopant in selected areas of the substrate to form a plurality of resistor bodies as a precursor to said resistors and a test resistor structure having a design sheet resistance $\rho_s^d$, said test resistor structure consisting of a side-by-side arrangement of a relatively narrow test resistor bar of design width $W_1$ and a relatively wide test resistor bar of design width $W_2$;

(b) measuring the resistance values $R_1$ and $R_2$ corresponding to an identical length $L_1$ of said narrow and wide test resistor bars, respectively, and calculating the deviation in design width $\Delta W$ by using the relationship $\Delta W = (W_2 R_2 - W_1 R_1)/(R_1 - R_2)$; and obtaining the difference $\Delta \rho_s$ between the measured sheet resistance $\rho_s^m$ and design sheet resistance $\rho_s^d$ by the relationships $$\rho_s^m = (W_2 - W_1) R_1 R_2 / L_1 (R_1 - R_2)$$

and $$\Delta \rho = \rho_s^m - \rho_s^d;$$

(c) calculating by utilizing said $\Delta W$ and $\Delta \rho_s$ the adjustment in length $\Delta L$ to said design lengths $L_i$ (i=1, 2, 3 ...) necessary to obtain resistors whose resistances correspond precisely to their design resistances $R_i$ (i=1, 2, 3 ...) and obtaining the new lengths $L_i \pm \Delta L$ of said resistors;

(d) forming a contact level layer sensitive to E-beam on said substrate;

(e) supplying said adjustments in length to an E-beam generating system to form a pair of contact areas on each of said resistor bodies at a separation corresponding to said new lengths $L_i \pm \Delta L$; and (f) forming metal contacts in said contact areas.

10. A method of making a precision resistor having a predetermined design resistance R and length L on a substrate, said method comprising the steps of:

(a) forming a material of a predetermined design sheet resistance in a pattern on said substrate, said pattern including a resistor body of a predetermined shape and a test resistor structure;

(b) measuring the sheet resistance of said test structure;

(c) determining the difference $\Delta \rho_s$ between the measured sheet resistance and the design sheet resistance;

(d) calculating by utilizing $\Delta \rho_s$ the necessary adjustment in length $\Delta L$ to said design length L to obtain a resistor whose resistance precisely corresponds to said design resistance R;

(e) calculating a new length $L \pm \Delta L$; and (f) forming a pair of highly conductive contacts contacting said resistor body at a relative separation corresponding to said new length.

11. A method of making a precision resistor having a predetermined design resistance R and length L on a substrate, said method comprising the steps of:

(a) forming a material of a predetermined design sheet resistance in a pattern on said substrate, said pattern including a resistor body of a predetermined shape and a test resistor structure having a predetermined design width;

(b) measuring the sheet resistance of said pattern by measuring the resistance of said test structure;

(c) determining the difference $\Delta \rho_s$ between the measured and design sheet resistances;

(d) determining the variation $\Delta W$ in said design width;

(e) calculating by utilizing $\Delta \rho_s$ and $\Delta W$ the adjustment in length L necessary to obtain from said resistor body a resistor whose resistance precisely corresponds to said design resistance;

(f) calculating a new length $L \pm \Delta L$; and (g) forming a pair of highly conductive contacts contacting said resistor body at a relative distance corresponding to said new length.

12. The method as recited in claim 10 or 11 wherein said substrate is semiconductor silicon.

13. The method as recited in claim 12 wherein said material is polysilicon.

* * * * *